United States Patent
Wiseman

(10) Patent No.: US 7,462,903 B1
(45) Date of Patent: Dec. 9, 2008

(54) METHODS FOR FABRICATING SEMICONDUCTOR DEVICES AND CONTACTS TO SEMICONDUCTOR DEVICES

(75) Inventor: Joseph William Wiseman, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 423 days.

(21) Appl. No.: 11/227,657

(22) Filed: Sep. 14, 2005

(51) Int. Cl.
H01L 29/788 (2006.01)
H01L 29/41 (2006.01)

(52) U.S. Cl. ............... 257/315; 438/586; 438/587; 438/279; 257/E29.3; 257/E21.68; 257/E21.422; 257/E21.179

(58) Field of Classification Search ............... 438/253, 438/279, 586, 587, 588; 257/210, 211, 206, 257/773, 776, 315, E29.3, E21.68, E21.422, 257/E21.179
See application file for complete search history.

(56) References Cited

U.S. PATENT DOCUMENTS

| | | | | |
|---|---|---|---|---|
| 4,651,183 A * | 3/1987 | Lange et al. | ............ | 257/296 |
| 5,140,389 A * | 8/1992 | Kimura et al. | ............ | 257/309 |
| 5,309,386 A * | 5/1994 | Yusuki et al. | ............ | 365/51 |
| 5,517,041 A * | 5/1996 | Torii et al. | ............ | 257/206 |
| 5,635,786 A * | 6/1997 | Fujimoto et al. | ........ | 310/316.01 |
| 5,723,908 A * | 3/1998 | Fuchida et al. | ............ | 257/758 |
| 5,899,717 A * | 5/1999 | Jun | ............ | 438/262 |
| 6,156,601 A * | 12/2000 | Lee et al. | ............ | 438/238 |
| 6,200,856 B1 * | 3/2001 | Chen | ............ | 438/257 |
| 6,291,846 B1 * | 9/2001 | Ema et al. | ............ | 257/296 |
| 6,344,391 B1 * | 2/2002 | Lee et al. | ............ | 438/253 |
| 6,614,079 B2 * | 9/2003 | Lee et al. | ............ | 257/382 |
| 6,730,570 B2 * | 5/2004 | Shin et al. | ............ | 438/299 |
| 6,743,675 B2 * | 6/2004 | Ding | ............ | 438/257 |
| 6,747,326 B2 * | 6/2004 | Tran | ............ | 257/408 |
| 6,878,586 B2 * | 4/2005 | Kimura et al. | ............ | 438/253 |
| 6,900,124 B1 | 5/2005 | Kim et al. | | |
| 6,900,540 B1 * | 5/2005 | Teig et al. | ............ | 257/758 |
| 6,936,898 B2 * | 8/2005 | Pelham et al. | ............ | 257/371 |
| 7,045,834 B2 * | 5/2006 | Tran et al. | ............ | 257/208 |
| 7,098,512 B1 * | 8/2006 | Pelham et al. | ............ | 257/371 |
| 7,217,962 B1 * | 5/2007 | Masleid | ............ | 257/206 |
| 7,326,613 B2 * | 2/2008 | Yun et al. | ............ | 438/244 |
| 7,339,221 B2 * | 3/2008 | Shiratake | ............ | 257/296 |
| 7,348,640 B2 * | 3/2008 | Yamada | ............ | 257/390 |
| 2001/0011176 A1 * | 8/2001 | Boukhny | ............ | 606/169 |
| 2004/0038476 A1 * | 2/2004 | Tran | ............ | 438/238 |
| 2004/0119100 A1 * | 6/2004 | Nowak et al. | ............ | 257/204 |
| 2004/0147114 A1 * | 7/2004 | Park et al. | ............ | 438/666 |
| 2004/0217407 A1 * | 11/2004 | Cho et al. | ............ | 257/306 |
| 2005/0070080 A1 * | 3/2005 | Lee et al. | ............ | 438/587 |

(Continued)

Primary Examiner—M. Wilczewski
(74) Attorney, Agent, or Firm—Ingrassia, Fisher & Lorenz, P.C.

(57) ABSTRACT

Methods for fabricating semiconductor structures and contacts to semiconductor structures are provided. A method comprises providing a substrate and forming a gate stack on the substrate. The gate stack is formed having a first axis. An impurity doped region is formed within the substrate adjacent to the gate stack and a dielectric layer is deposited overlying the impurity doped region. A via is etched through the dielectric layer to the impurity doped region. The via has a major axis and a minor axis that is perpendicular to and shorter than the major axis. The via is etched such that the major axis is disposed at an angle greater than zero and no greater than 90 degrees from the first axis. A conductive contact is formed within the via.

8 Claims, 4 Drawing Sheets

U.S. PATENT DOCUMENTS

2005/0077560 A1* 4/2005 Shiratake .................... 257/296
2005/0218708 A1* 10/2005 Gramss ...................... 297/408
2005/0272250 A1* 12/2005 Yun et al. .................. 438/622
2006/0138466 A1* 6/2006 Choi .......................... 257/208
2007/0049010 A1* 3/2007 Burgess et al. ............. 438/633
2008/0048333 A1* 2/2008 Seo et al. .................... 257/773

* cited by examiner

US 7,462,903 B1

METHODS FOR FABRICATING SEMICONDUCTOR DEVICES AND CONTACTS TO SEMICONDUCTOR DEVICES

FIELD OF THE INVENTION

The present invention generally relates to semiconductor devices, and more particularly relates to methods for fabricating semiconductor devices and conductive contacts to semiconductor devices.

BACKGROUND OF THE INVENTION

Flash electrically erasable and programmable read-only memories (EEPROM's) are a class of nonvolatile memory devices that are programmed by hot electron injection and erased by Fowler-Nordheim tunneling. FIG. 1 is a cross-sectional view of a conventional flash EEPROM memory cell. The cell 10 is formed on a substrate 12, having a heavily doped drain region 14 and source region 16 embedded therein. The drain and source regions typically contain lightly doped deeply diffused regions 18, 20, respectively, and more heavily doped shallow diffused regions 22, 24, respectively, embedded into the substrate 12. A channel region 26 separates the drain region 14 and source region 16. The cell 10 typically is characterized by a vertical gate stack 36 of a tunnel oxide layer 28, a floating gate 30 over the tunnel oxide layer, an interlevel dielectric layer 32, and a control gate 34 over the interlevel dielectric layer. However, flash memory devices may have other gate stack configurations, such as dual-bit gate stacks, that also are known in the art.

During IC fabrication, a conductive contact 50 is made to the control gate 34, source region 16, and/or the drain region 14 to access the memory device and allow interconnections between the memory device and other devices of the IC, as illustrated in FIG. 2. A conductive contact 50 is an opening through one or more insulating layers 40 that is subsequently filled with a conductive material to form a contact to a device region. The conductive material forming the contact, which often takes the form of a plug, may be tungsten or other metals. However, as the size of integrated circuit devices decreases, fabrication of the contacts to a memory device within the tolerances allowed by the relevant design rules becomes more difficult and has resulted in complex integration schemes for patterning, etching and filling to form the contacts. Misaligned contacts, such as contact 52, pose a significant challenge and can severely reduce device yield.

Accordingly, it is desirable to provide an improved method for forming a contact to a memory device that reduces complex overlay and masking steps. In addition, it is desirable to provide a method for forming a contact to a memory device that facilitates increased device density. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method is provided for fabricating a semiconductor structure. The method comprises the steps of providing a substrate and forming a gate stack on the substrate. The gate stack is oriented along a first axis. An impurity doped region is formed within the substrate adjacent to the gate stack and a dielectric layer is deposited overlying the impurity doped region. A via is etched through the dielectric layer to the impurity doped region. The via has a major axis and a minor axis that is perpendicular to and shorter than the major axis. The via is etched such that the major axis is disposed at an angle greater than zero and no greater than 90 degrees from the first axis. A conductive contact is formed within the via.

In accordance with another exemplary embodiment of the present invention, a method is provided for fabricating a contact to a semiconductor structure. The method comprises the steps of providing a semiconductor substrate and forming two parallel shallow trench isolation (STI) lines within the substrate. The two parallel STI lines are oriented parallel to a first axis. Two parallel gate stacks are formed overlying the substrate and are oriented substantially parallel to a second axis perpendicular to the first axis. The substrate is doped in an area bounded by the two parallel STI lines and the two parallel gates stacks to form an impurity doped region. A dielectric layer is deposited overlying the impurity doped region and a via is etched through the dielectric layer to the impurity doped region. The via has a major axis and a minor axis that is perpendicular to and shorter than the major axis. The major axis of the via is disposed at an angle greater than zero and no greater than 90 degrees from the first axis of the two parallel STI lines. A conductive material is deposited within the via.

In a further exemplary embodiment of the present invention, a semiconductor structure is provided. The semiconductor structure comprises a substrate and two parallel gate stacks on the substrate. The two parallel gate stacks are oriented parallel to a first axis. An impurity doped region is disposed between the two parallel gate stacks and a dielectric layer overlies the impurity doped region. A conductive contact extends through the dielectric layer and is electrically coupled to the impurity doped region. The conductive contact has a major axis and a minor axis that is perpendicular to and shorter than the major axis. The major axis is disposed at an angle greater than zero and less than 90 degrees from the first axis.

BRIEF DESCRIPTION OF THE DRAWINGS

The present invention will hereinafter be described in conjunction with the following drawing figures, wherein like numerals denote like elements, and wherein:

FIG. 3 is a cross-sectional view of a semiconductor structure having shallow trench isolation lines formed within a substrate;

FIG. 4 is a top view of the semiconductor structure of FIG. 3;

FIG. 5 is a top view of the semiconductor structure of FIG. 4 with parallel gate stacks formed thereon;

FIG. 6 is a cross-sectional view of the semiconductor structure of FIG. 5;

FIG. 7 is a cross-sectional view of the semiconductor structure of FIG. 6 in accordance with an exemplary embodiment of the present invention;

FIG. 8 is a cross-sectional view of the semiconductor structure of FIG. 7 in accordance with an exemplary embodiment of the present invention;

FIG. 9 is a top view of the semiconductor structure of FIG. 8; and

FIG. 10 is an x-y coordinate system showing a major axis of the conductive contact of FIG. 9 at angles from the y-axis and the x-axis.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention. This description uses terms such as x axis, y axis, and the like. These terms indicating orientation are used only for purposes of clarity of description. The invention is not to be limited by such orientation terms.

In accordance with an exemplary embodiment of the present invention, FIGS. 3-10 illustrate method steps for manufacturing a semiconductor structure 100 that provides contact to a semiconductor device, such as flash EEPROM memory cell 10, or any other suitable semiconductor device, especially those semiconductor devices having highly repetitive structures such as memory devices. FIGS. 3-10 illustrate various top views and cross-sectional views of semiconductor structure 100. Various steps in the manufacture of semiconductor structure 100, including the semiconductor devices thereof, are well known and so, in the interest of brevity, many conventional steps will only be mentioned briefly herein or will be omitted entirely without providing well known process details.

Figure 3:
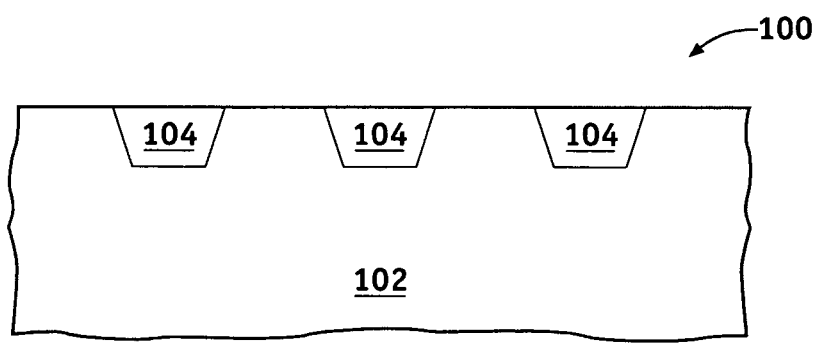
FIGS. 3-10 illustrate a method of forming a semiconductor structure in accordance with an exemplary embodiment of the present invention. In particular.
Figure 4:
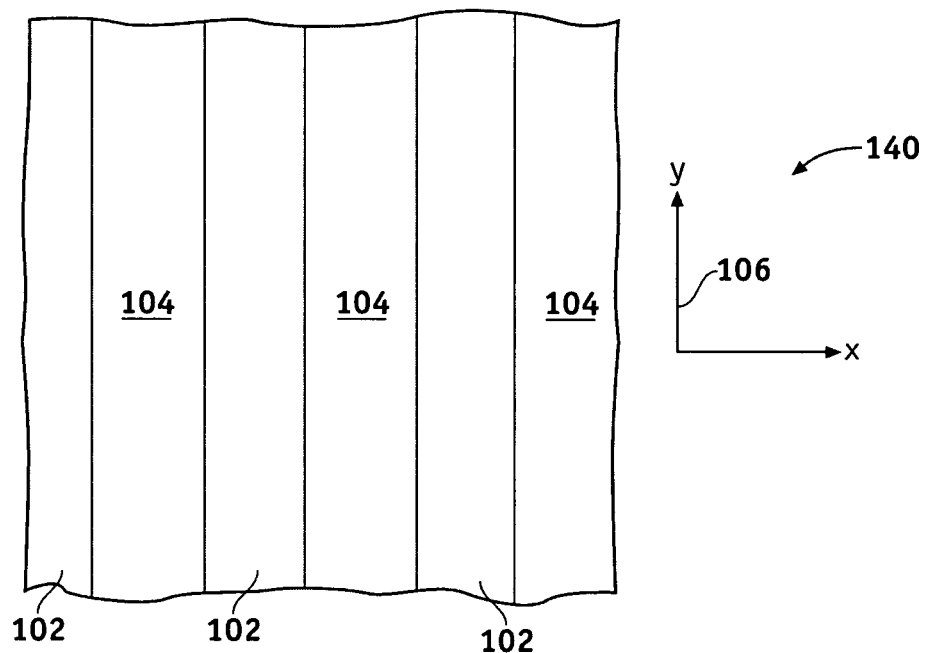

As illustrated in FIGS. 3 and 4, the manufacture of semiconductor structure 100 begins by providing a silicon substrate 102. As used herein, the term "silicon substrate" will be used to encompass the relatively pure silicon materials typically used in the semiconductor industry as well as silicon admixed with other elements such as germanium, carbon, and the like. The term "silicon substrate" also is used to encompass the substrate itself together with metal or insulator layers that may overly the substrate. Silicon substrate 102 may be a bulk silicon wafer or a thin layer of silicon on an insulating layer (commonly known as a silicon-on insulator wafer or SOI wafer) that, in turn, is supported by a silicon carrier wafer.

Parallel shallow trench isolation (STI) lines 104 or other forms of electrical isolation are formed to electrically isolated subsequently formed individual devices. In general, an STI line includes a shallow trench that is etched into the surface of the semiconductor substrate and that is subsequently filled with an insulating material. After the trench is filled with the insulating material, the surface is usually planarized, for example by chemical mechanical planarization (CMP). Those of skill in the art will recognize that many known processes and many known materials can be used to form STI lines or other forms of electrical isolation between devices making up an integrated circuit, and, accordingly, those known processes and materials need not be discussed herein. STI lines 104 are formed along a first axis 106, such as the y-axis of a coordinate system 140 illustrated in FIG. 4.

Figure 1:
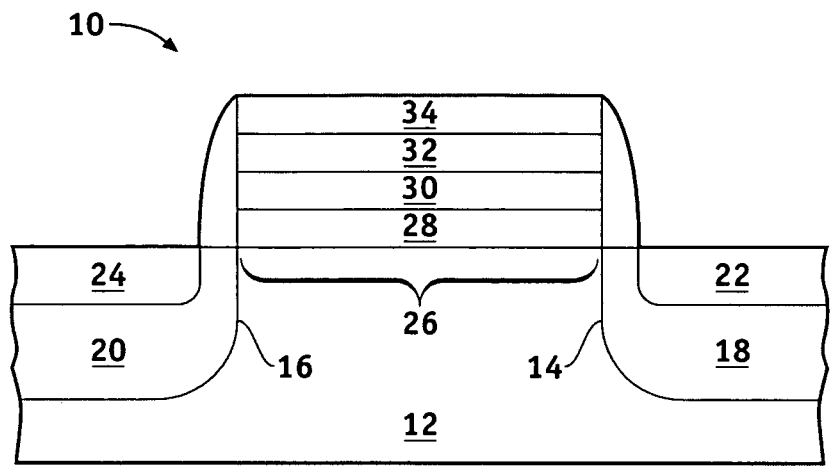
FIG. 1 is a cross-sectional view of a conventional flash EEPROM memory device with a floating gate.
Figure 2:
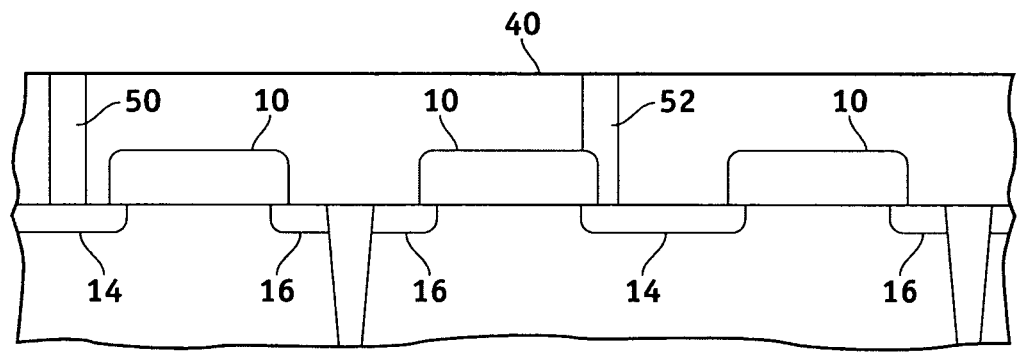
FIG. 2 is a cross-sectional view of conductive contacts electrically coupled to conventional flash EEPROM memory devices.
Figure 5:
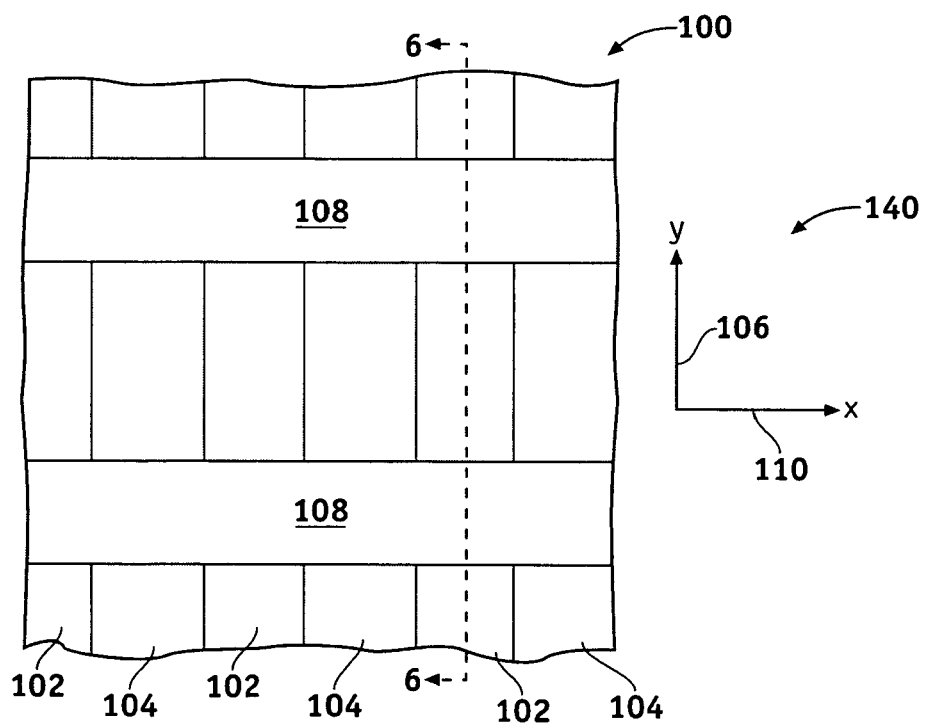
Figure 6:
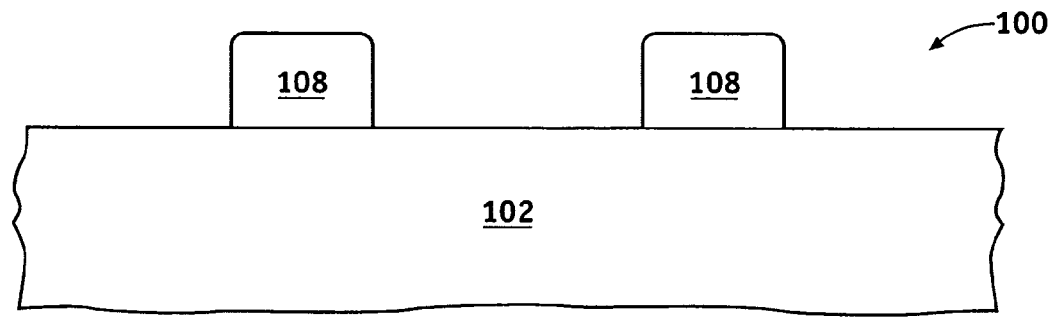

Referring to FIGS. 5 and 6, parallel gate stacks 108 are formed overlying substrate 102 and STI 104. Gate stacks 108 are formed having a second axis 110, such as the x-axis of coordinate system 140 illustrated in FIG. 5, that is perpendicular to the first axis 106 of parallel STI lines 104. Gate stacks 108 can comprise any of the known material layers and configurations of material layers known in the art for fabricating gate stacks of metal-oxide-semiconductor (MOS) devices, such as, for example, vertical gate stack 36 of FIG. 1, dual-bit gate stacks, and the like.

Figure 7:
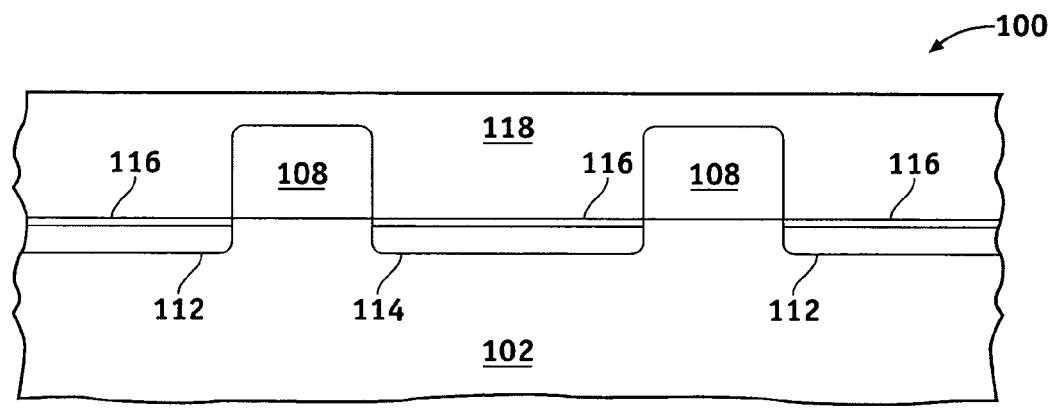

As illustrated in FIG. 7, a common source region 112 and a common drain region 114 are formed in the silicon substrate by introducing by ion implantation appropriate impurity dopants such as arsenic or phosphorus for N-channel MOS transistors and boron for P-channel MOS transistors. Referring back to FIG. 5 momentarily, in accordance with an exemplary embodiment of the invention, gate stacks 108 may be used as a mask during the ion implantation process(es). Accordingly, the source regions 112 and drain regions 114 may be bounded by the gate stacks 108 and the STI lines 104. Referring again to FIG. 7, in accordance with another exemplary embodiment of the invention, a metal silicide contact 116 is formed to common source region 112 and to common drain region 114 to facilitate Ohmic contact to those regions. A dielectric layer 118, such as a silicon oxide or other insulator, is deposited, for example by low pressure chemical vapor deposition (LPCVD) or plasma enhanced chemical vapor deposition (PECVD), overlying semiconductor structure 100 including metal silicide contacts 116.

Figure 8:
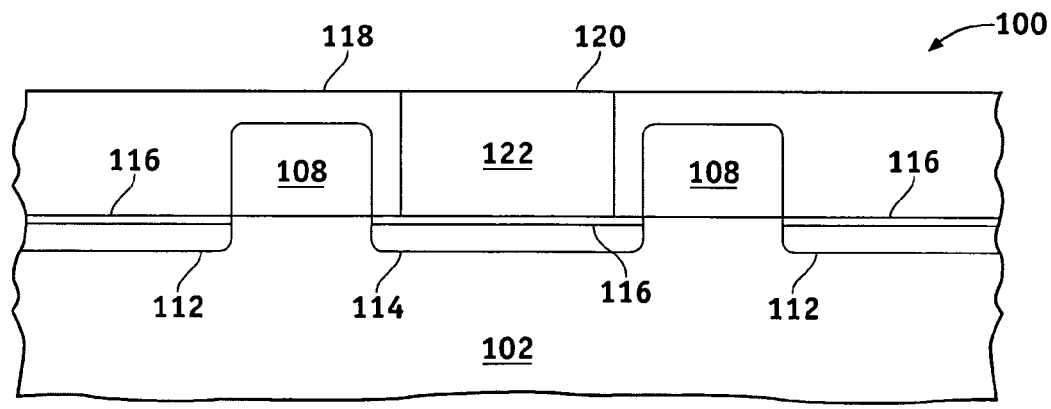

A via 120 is etched through dielectric layer 118 to metal silicide contact 116 of drain region 112. One or more conductive materials then may be deposited within via 120 to form a conductive contact 122 that is electrically coupled to drain region 114, as illustrated in FIG. 8. While FIG. 8 illustrates conductive contact 122 electrically coupled to drain region 114, it will be appreciated that a similar conductive contact could be made to electrically couple to source region 112 and/or gate stack 108 in addition to, or instead of, drain region 114. After formation of conductive contact 122, any excess material deposited on dielectric layer 118 outside of via 120 may be removed by any conventional method, such as CMP.

Figure 9:
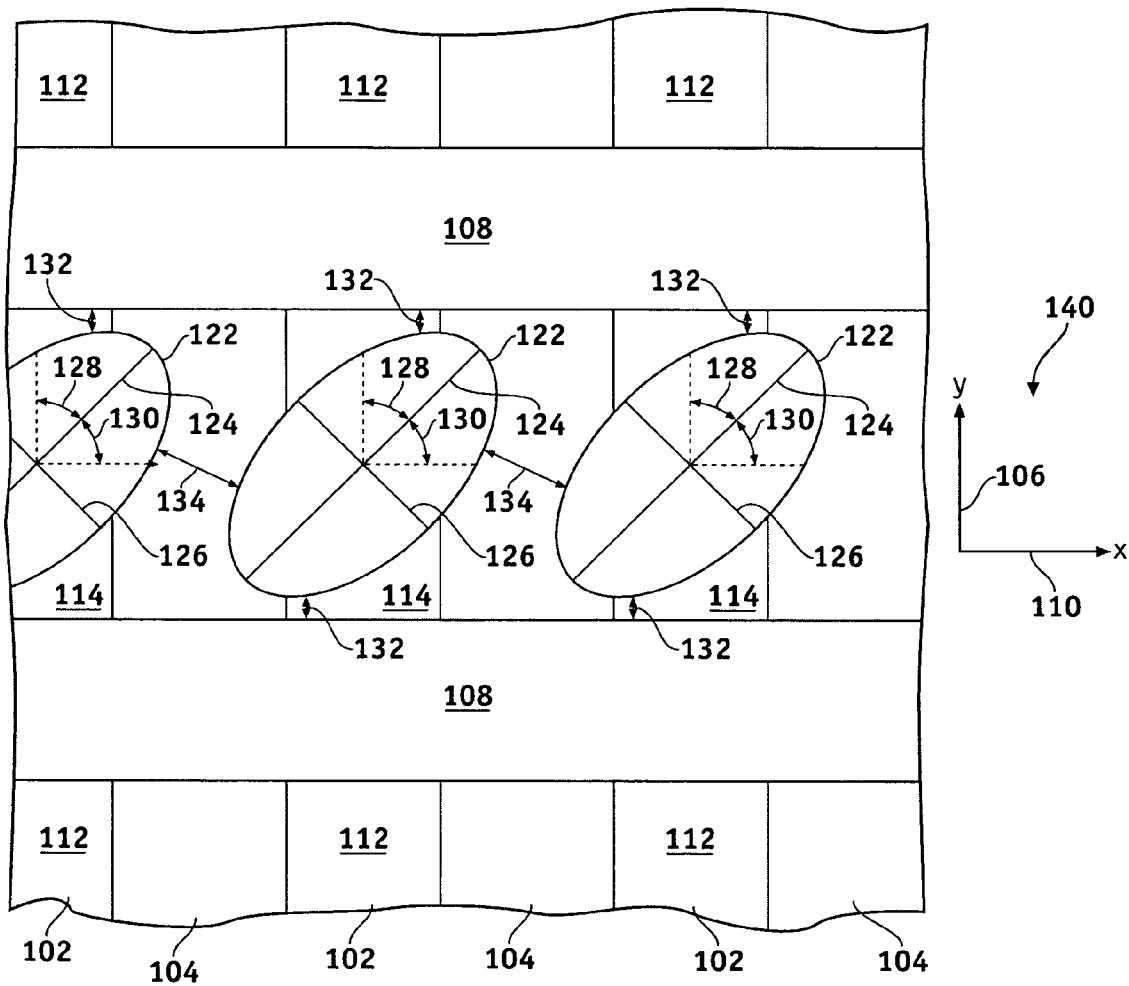
Figure 10:
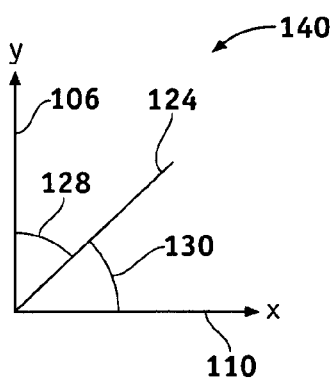

Referring to FIG. 9, which is a top view of semiconductor structure 100 illustrated in FIG. 8, in accordance with an embodiment of the invention via 120, and hence conductive contact 122, is formed having a major axis 124 and a minor axis 126 that is perpendicular to, and of a shorter length than, major axis 124. Accordingly, via 120 and contact 122 may be in the form of an ellipse, a rectangle, or the like. As further illustrated in FIG. 10, in accordance with a preferred embodiment of the invention, major axis 124 of via 120 and conductive contact 122 is disposed an angle 128 from first axis 106 of parallel STI lines 104 and an angle 130 from second axis 110 of gate stacks 108. Because the axes 106 and 110 are perpendicular, the sum of angles 128 and 130 is 90 degrees. Accordingly, major axis 124 of conductive contact 122 may lie at any angle 128 greater than zero and no greater than approximately 90 degrees from first axis 106 or, alternatively, at any angle 130 greater than zero and no greater than approximately 90 degrees from second axis 110. The length of major axis 124, the length of minor axis 126, and the angle 128 of via 120 and hence conductive contact 122 can be of dimensions such that a maximum area between adjacent gate stacks 108 is utilized to form the conductive contact while also maximizing the distance 132 between the contact 122 and adjacent gate stacks 108 and maximizing the distance 134 between adjacent conductive contacts 122. In other words, by manipulating the dimension of the major axis 124, the minor axis 126, and the angle 128 (or angle 130), the conductive contact 122 can be of an optimum size to ensure sufficient electric coupling to the impurity doped region between gate stacks (e.g., drain region 114 in FIG. 9) while minimizing the risk that, when formed, conductive contact 122 contacts adjacent gate stacks 108 or adjacent conductive contacts. For example, if the spacing between adjacent gate stacks is 310 nm, in a preferred embodiment of the invention the major axis can be about 170 nm, the minor axis about 110 nm and the angle 128 can be about 45 degrees. In a preferred embodiment of the invention, conductive contact 122 is disposed with major axis 124 at an angle in the range of about 30 degrees to about 60 degrees from first axis 106 of STI lines 104. In a more preferred embodiment of the invention, conductive contact 122 is disposed with major axis 124 at an angle of about 45 degrees from first axis 106 of STI lines 104 and second axis 110 of gate stacks 108.

Accordingly, a method for fabricating a semiconductor structure that provides a conductive contact to a semiconductor device is provided. The method minimizes misalignment problems associated with lithography of small conductive contacts. The dimensions and rotation of the contacts may be manipulated to optimize the area utilized to form the contacts. In addition, the dimension and rotation of the conductive contacts can be optimized to minimize the risk that the conductive contacts will contact adjacent gate stacks or adjacent conductive contacts.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor structure comprising:
    a substrate;
    two parallel gate stacks on said substrate, wherein said two parallel gate stacks are oriented parallel to a first axis;
    an impurity doped region disposed between said two parallel gate stacks;
    a dielectric layer disposed overlying said impurity doped region, said dielectric layer having a via extending therethrough to said impurity doped region;
    a conductive contact that is disposed entirely within said via of said dielectric layer and is electrically coupled to said impurity doped region, wherein said conductive contact has a major axis and a minor axis that is perpendicular to and shorter than said major axis, and wherein said major axis is disposed at an angle greater than zero and less than 90 degrees from said first axis.

2. The semiconductor structure of claim 1, wherein each of said two parallel gate stacks comprises a portion of a flash EEPROM memory array.

3. The semiconductor structure of claim 1, wherein said major axis is disposed at angle in the range of about 30 degrees to about 60 degrees from said first axis.

4. The semiconductor structure of claim 3, wherein said angle is approximately 45 degrees from said first axis.

5. The semiconductor structure of claim 1, wherein said conductive contact has an elliptical shape.

6. The semiconductor structure of claim 1, wherein each of said two parallel gate stacks comprises:
    a tunnel oxide layer;
    a floating gate overlying said tunnel oxide;
    an interlevel dielectric layer overlying said floating gate; and
    a control gate overlying said interlevel dielectric layer.

7. The semiconductor structure of claim 1, further comprising two parallel STI lines disposed within said substrate and substantially perpendicular to and underlying said two parallel gate stacks.

8. The semiconductor structure of claim 7, wherein said impurity doped region comprises a drain region that is bounded by said two parallel STI lines and said two parallel gate stacks.

* * * * *